(12) United States Patent
Soga et al.

(10) Patent No.: US 6,402,570 B2
(45) Date of Patent: Jun. 11, 2002

(54) AUTOMOTIVE LAMP UNIT AND METHOD FOR MANUFACTURING THE SAME

(75) Inventors: Hisashi Soga; Kouichi Sinzawa, both of Tokyo (JP)

(73) Assignee: Kabushiki Kaisha T AN T, Tokyo (JP)

( * ) Notice: Subject to any disclaimer, the term of this patent is extended or adjusted under 35 U.S.C. 154(b) by 0 days.

(21) Appl. No.: 09/739,376

(22) Filed: Dec. 19, 2000

(30) Foreign Application Priority Data

Dec. 28, 1999 (JP) ............................................ 11-372485

(51) Int. Cl.[7] ............................................ H01R 13/405
(52) U.S. Cl. .................... 439/736; 439/475; 439/34; 439/76.2; 439/180; 439/720; 439/213; 439/949; 439/813
(58) Field of Search ................................. 439/516, 475, 439/34, 76.2, 163, 180, 36, 720, 741, 733.1, 213, 212, 949, 734, 43, 49, 736; 361/813

(56) References Cited

U.S. PATENT DOCUMENTS 4,894,018 A * 1/1990 Phillips et al. ................. 439/81
4,965,933 A * 10/1990 Mraz et al. .................... 29/882
5,359,761 A   11/1994 Whitson et al.
5,600,100 A    2/1997 Andrei-Alexandru et al.
5,609,652 A    3/1997 Yamada et al.
5,895,618 A    4/1999 Schwab et al.
5,937,507 A    8/1999 Asakura et al.
6,008,982 A   12/1999 Smith
6,129,560 A * 10/2000 Baur et al. ................. 439/76.1

* cited by examiner

Primary Examiner—Tho D. Ta
Assistant Examiner—Truc Nguyen
(74) Attorney, Agent, or Firm—Nixon and Vanderhye P.C.

(57) ABSTRACT

An automotive lamp unit includes a bus bar unit forming a circuit with a plurality of bus bars connected with each other via a bridge portion, the bus bar unit including terminals, for connection to switches and a power source, and a supporting member for supporting a lamp, the circuit serving to switch on the lamp, and a resin base member provided with the bus bar unit mounted thereon at a predetermined position, and a small hole formed in the resin base member at a position thereof associated with the bridge portion. The plurality of bus bars are separated from each other at the bridge portion which is disposed in the small hole.

6 Claims, 5 Drawing Sheets

AUTOMOTIVE LAMP UNIT AND METHOD FOR MANUFACTURING THE SAME

BACKGROUND OF THE INVENTION

1. Field of the Invention

The present invention relates to automotive lamp units including automotive lamps to be mounted in vehicles, such as passenger compartment lamps, map lamps, vanity-mirror lamps, door lamps, and trunk compartment lamps. In particular, the present invention relates to an automotive lamp unit and a method for manufacturing the same, in which a circuit for switching on automotive lamps by connecting the automotive lamps to a power source (battery) is formed with bus bars.

2. Description of the Related Art

Hitherto, a plurality of bus bars have been individually inserted in recesses formed in a resin base member, each bus bar serving as a wire, so that the bus bars are used as a circuit.

In the above-described known technology, a problem has been found in that since the known automotive lamp unit includes a plurality of bus bars, when, for example, four bus bars constitute a circuit, the four bus bars must be individually inserted in recesses of a base member, whereby manufacturing processes and working period are increased, thereby increasing manufacturing costs.

Another problem has been found in that when vibration is applied to the bus bars inserted in the recesses of the base member, there is a risk of the bus bars removing from the recesses and coming into contact with each other, thereby causing short circuits.

SUMMARY OF THE INVENTION

Accordingly, it is an object of the present invention to provide an automotive lamp unit and a method for manufacturing the same, in which manufacturing is performed in two major processes, that is, a plurality of bus bars are formed integrally with each other via bridge portions and the plurality of bus bars mounted on a base member are separated from each other at the bridge portions, thereby forming a circuit, whereby manufacturing costs can be reduced by improving efficiency in the manufacturing processes and reducing working period.

It is another object of the present invention to provide an automotive lamp unit and a method for manufacturing the same, in which bridge portions of a plurality of bus bars are bent so as to come into contact with inner faces of small holes formed in a base member, whereby each bus bar is fixed to the base member by a fixing member such as recesses and the small holes, thereby preventing the bus bars from removing from the base member by vibration.

To these ends, according to an aspect of the present invention, an automotive lamp unit comprises a bus bar unit forming a circuit with a plurality of bus bars connected with each other via a bridge portion, the bus bar unit including terminals, for connection to switches and to a power source, and a supporting member for supporting a lamp, the circuit serving to switch on the lamp; and a resin base member provided with the bus bar unit mounted thereon at a predetermined position thereof, a small hole being formed in the resin base member at a position thereof associated with the bridge portion. The plurality of bus bars are separated from each other at the bridge portion which is disposed in the small hole.

In the automotive lamp unit, cut-and-raised parts of the plurality of bus bars separated from each other at the bridge portion disposed in the small hole may be in contact with an edge of the small hole. The bridge portion may be formed so as to have a reduced width, thereby facilitating separation of the plurality of bus bars from each other, or may be provided with a groove for cutting and raising thereat so that the bridge portion has a reduced thickness, whereby the bridge portion is easily cut and raised.

According to another aspect of the present invention, a method for manufacturing an automotive lamp unit comprises the steps of mounting at least one part of a bus bar unit including a plurality of bus bars integrated with each other via a bridge portion on a base member made of a molded resin at a predetermined position of the base member; and separating the plurality of bus bars at the bridge portion by pressing, the bridge portion being disposed in a small hole formed in the base member at a position opposing a rear face of the bridge portion. In the method, cut-and-raised parts of the plurality of bus bars separated from each other at the bridge portion disposed in the small hole may be brought into contact with an edge of the small hole by pressing.

DESCRIPTION OF THE PREFERRED EMBODIMENTS

An embodiment of an automotive lamp unit according to the present invention is described below with reference to the drawings.

Figure 1:
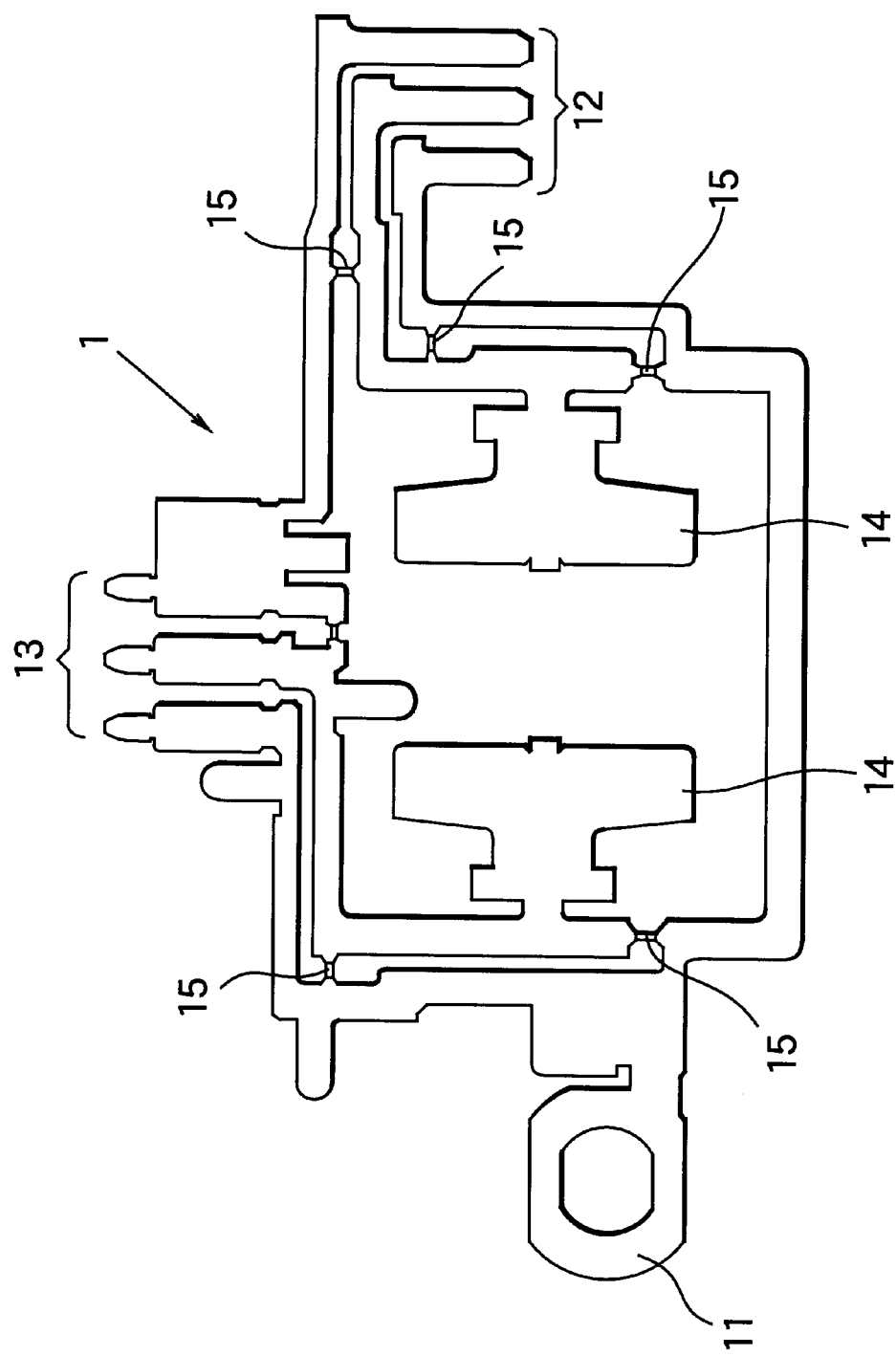
FIG. 1 is a front view of a bus bar unit used in an automotive lamp unit according to the present invention.
Figure 2:
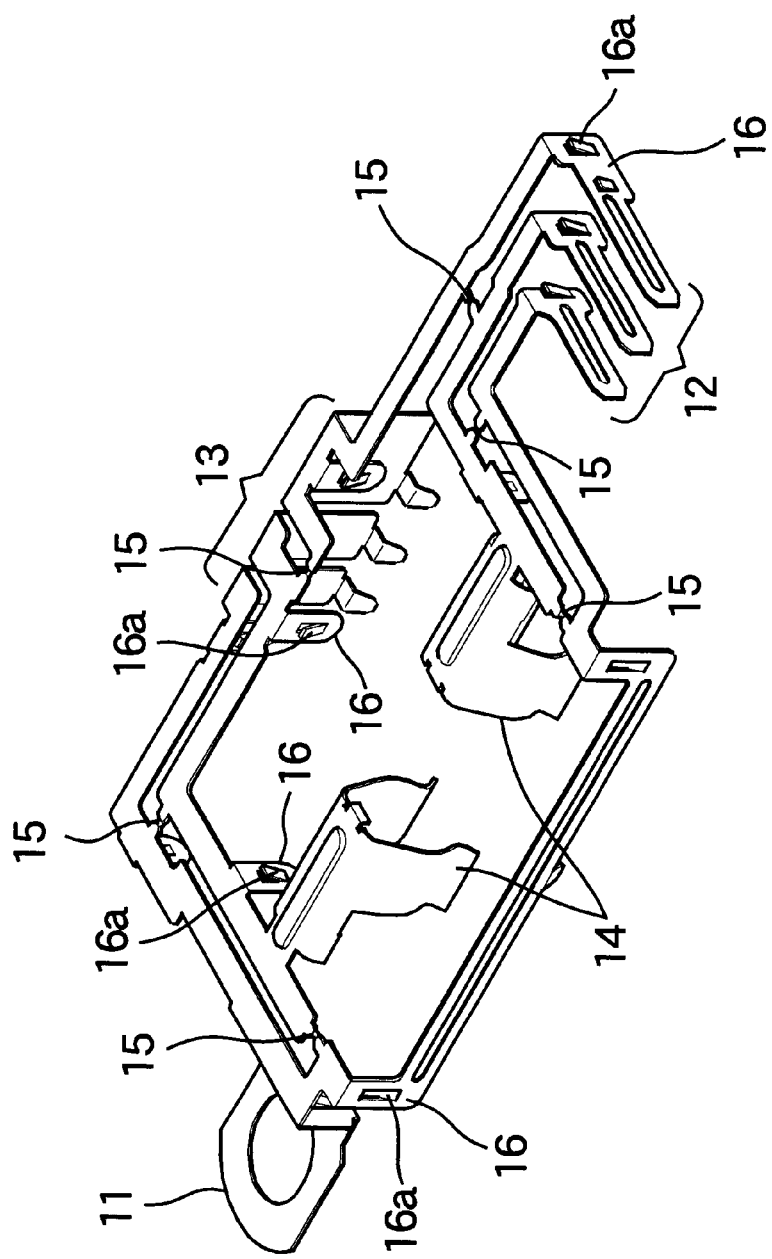
FIG. 2 is a perspective view of the bus bar unit shown in FIG. 1 formed by pressing.

FIG. 1 is a front view of a bus bar unit 1 in an extended state. FIG. 2 is a perspective view of the bus bar unit 1 formed by pressing. In FIGS. 1 and 2, a terminal 11 is a grounding terminal, terminals 12 are to be connected to a power source (battery) and a door switch, fixed terminals 13 form a slide switch, and supporting tabs 14 support a fuse-type lamp.

The bus bar unit includes a plurality of bus bars connected with each other via six bridge portions 15. When manufacturing the known automotive lamp unit, four bus bars are embedded in the lamp unit, which are not connected with each other via bridge portions such as the bridge portions 15. The bridge portions 15 have a reduced width and are provided with cut-in lines so that the bridge portions are easily cut and raised in the succeeding pressing process.

The bus bar unit 1 is provided with bent parts 16 formed at predetermined positions of the bus bar unit 1. Each bent part 16 is provided with a raised tab 16a which cuts into an inner face of a groove 22 of a base member 2 (described below) when the raised tab 16a is mounted in the groove 22, so that the bus bar unit 1 does not remove from the base member 2. In the drawings, ten raised tabs 16a are shown.

Figure 3:
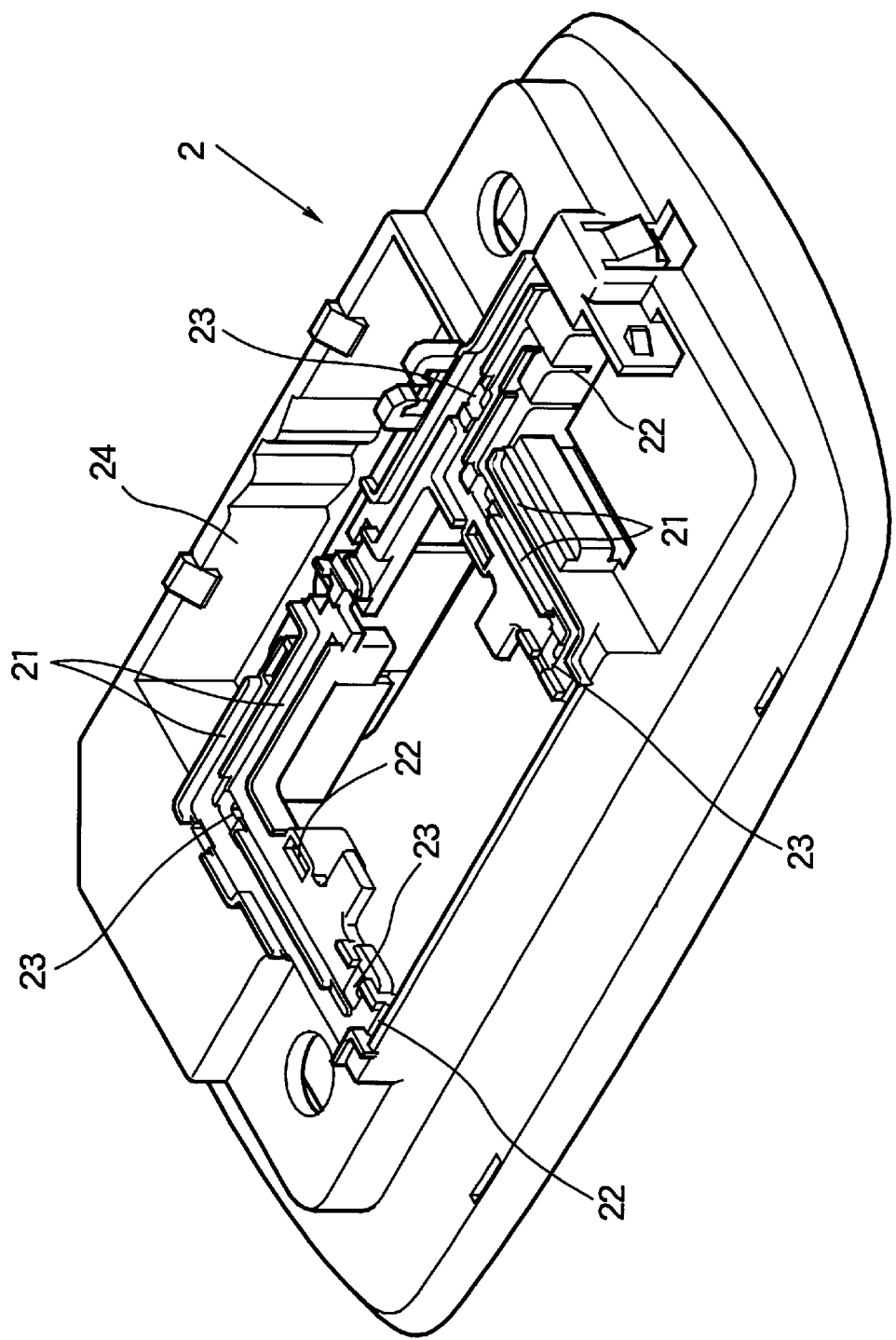
FIG. 3 is a perspective view of a base member to be mounted with the bus bar unit shown in FIG. 1.

In FIG. 3, the base member 2 is made of a resin formed by an injection mold. The base member 2 is provided with grooves 21 which engage with the bus bar unit 1 and the grooves 22 which engage with the bent parts 16 at the raised tabs 16a thereof being cut in the inner faces of the grooves 22. Although according to the present embodiment, the bus bar unit 1 is fixed to the base member 2 by the grooves 21 engaging with the bus bar unit 1 and the grooves 22 engaging with the bent parts 16, the bus bar unit 1 may be fixed to the base member 2 either at the grooves 21 or at the grooves 22. The bus bar unit 1 may be provided with any type of grooves other than the grooves 21 and 22 formed in the surfaces of the base member 2, which engage with the raised tabs 16a of the bus bar unit 1. The bus bar unit 1 may be fixed to the base member 2 by hooks, raised at portions of the base member 2 at which the bus bar unit 1 is mounted, engaging with the bus bar unit 1.

The same number of small holes 23 as the number of the bridge portions 15 are formed in the grooves 21 to engage with the bus bar unit 1, the small holes 23 being formed at positions associated with the bridge portions 15 of the bus bar unit 1 when the bus bar unit 1 is mounted in the grooves 21 so that raised parts of the bridge portions 15 are inserted in the small holes 23 when the bridge portions 15 are raised. A movable-contact-point-receiving part 24 receives a movable-contact-point member which moves on the fixed terminals 13.

Figure 4:
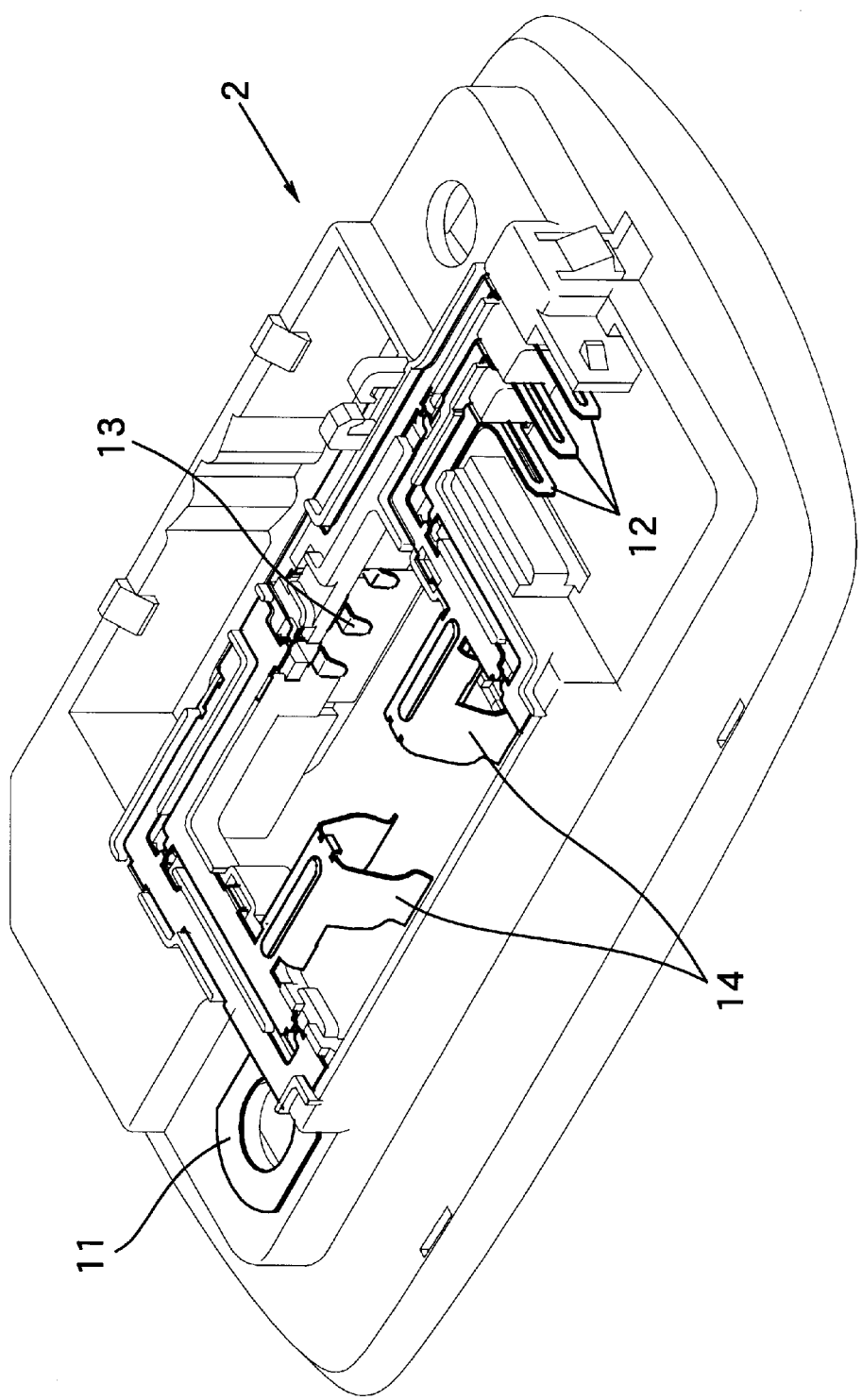
FIG. 4 is a perspective view of the base member mounted with the bus bar unit shown in FIG. 2.

A method for mounting the bus bar unit 1 on the base member 2, as shown in FIG. 4, is described below.

The integrated bus bar unit 1 is mounted in the grooves 21 of the base member 2, and the bent parts 16 are engaged with the grooves 22, the raised tabs 16a of the bent parts 16 cutting in the inner faces of the grooves 22. The bridge portions 15 of the bus bar unit 1 are positioned at the small holes 23 of the base member 2.

The bus bar unit 1 thus mounted on the base member 2 before forming a circuit is electrically divided at the bridge portions 15 in a process described below. That is, the bus bar unit 1 mounted on the base member 2 is pressed at the bridge portions 15 by a pressing machine having pins at positions associated with the bridge portions 15 substantially at intermediate parts thereof, whereby the bridge portions 15 having a reduced width at intermediate parts thereof are cut at cut-in parts of the bridge portions 15, and are electrically divided.

Figure 5:
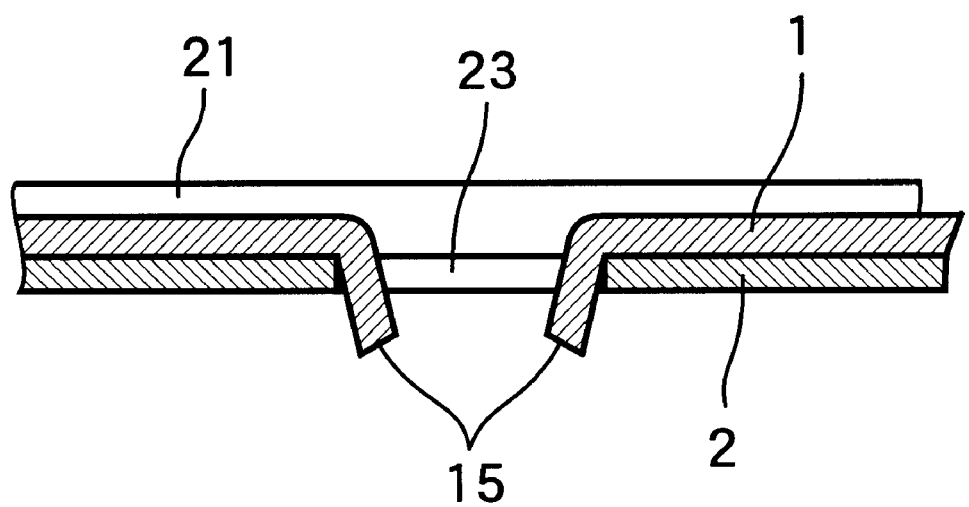
FIG. 5 is an expanded sectional view of a portion of the base member and the bus bar unit shown in FIG. 4.

By further pressing the pins, two cut flaps of each bridge portion 15 are raised and are inserted in the small hole 23, the raised flaps being brought into contact with an edge of each small hole 23. Bus bars included in the bus bar unit 1 and separated from each other are firmly fixed to the base member 2 by being engaged with the grooves 21 and 22 and by the raised flaps of the bridge portions 15 in contact with the edges of the small holes 23 (see FIG. 5).

After pressing, the bus bars separated from each other at the bridge portions 15 and forming a circuit are mounted with a slide switch and connectors connected to the terminals 12, whereby lamps can be switched on.

According to the present invention, a plurality of bus bars are integrated with each other via bridge portions, and the integrated bus bars are separated from each other at the bridge portions after the bus bars are mounted on a base member, thereby forming a circuit. With this arrangement, an automotive lamp unit can be manufactured in two major processes, that is, a process of mounting the integrated bus bars on the base member and the other process of separating the bus bars from each other at the bridge portions, thereby improving efficiency in the manufacture and reducing working period, whereby manufacturing costs can be reduced.

Raised flaps of the cut bridge portions are brought into contact with edges of the small holes formed in the base member, whereby the bus bars are mounted on the base member at the grooves and the small holes formed in the base member, thereby preventing the bus bars from removing from the base member by vibration.

What is claimed is:

1. An automotive lamp unit comprising:
   a bus bar unit having a plurality of bus bars forming a circuit, wherein
   at least one and another of said bus bars have a severed bridge portion which establish a pair of opposed raised flaps such that, prior to severance, said bridge portion connects said one and another bus bars together, and such that after severance, said one and another bus bars are physically and electrically divided from one another, and wherein the lamp unit further comprises,
   a resin base member provided with the bus bar unit mounted thereon at a predetermined position thereof, a small hole being formed in the resin base member at a position thereof associated with the bridge portion; wherein
   the bus bar unit includes terminals, for connection to switches and to a power source, and a supporting member for supporting a lamp, the circuit serving to switch on the lamp; and wherein
   the raised flaps of said severed bridge portion extend into the small hole and are engaged with an edge thereof so as to fix said one and another of said bus bars to said base member.

2. An automotive lamp unit according to claim 1, wherein the bridge portion has a reduced width, thereby facilitating severance of said bridge portion and the separation of said one and another bus bars from each other.

3. An automotive lamp unit according to claim 2, wherein the reduced width of the bridge portion is established by a cut-in line thereon.

4. An automotive lamp unit according to claim 1, wherein the base member includes grooves for receiving and retaining said at least one and another bus bars therein.

5. A method for manufacturing an automotive lamp unit, comprising the steps of:
   (i) providing a base member formed of a molded resin and defining a small hole therein;
   (ii) mounting at least one part of a bus bar unit which has at least one and another bus bars integrally connected to one another by a bridge portion onto the a predetermine position of the base member such that the bridge portion is associated with the small hole; and thereafter
   (iii) separating the one and another bus bars at the bridge portion from each other and fixing the one and another bus bars to the base member by pressing the bridge portion sufficiently to sever the bridge portion and thereby form a pair of opposed raised flaps which extend into the small hole of the base member and engage an edge thereof.

6. A method for manufacturing an automotive lamp unit according to claim 5, wherein the bridge portion has a region of reduced thickness, and wherein step (iii) includes pressing against the region of reduced thickness sufficiently to sever the bridge portion thereat.

* * * * *